(12) United States Patent
Cho

(10) Patent No.: US 10,790,475 B2
(45) Date of Patent: Sep. 29, 2020

(54) DISPLAY DEVICE INCLUDING POLARIZATION FILM

(71) Applicant: Samsung Display Co., Ltd., Yongin-si, Gyeonggi-do (KR)

(72) Inventor: Won Je Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/510,375

(22) Filed: Jul. 12, 2019

(65) Prior Publication Data

US 2019/0334130 A1 Oct. 31, 2019

Related U.S. Application Data

(62) Division of application No. 15/794,927, filed on Oct. 26, 2017, now Pat. No. 10,396,313.

(30) Foreign Application Priority Data

Dec. 1, 2016 (KR) .................. 10-2016-0162964

(51) Int. Cl.
*H01L 51/56* (2006.01)
*H01L 51/52* (2006.01)
*H01L 51/00* (2006.01)
*H01L 27/32* (2006.01)

(52) U.S. Cl.
CPC .......... *H01L 51/56* (2013.01); *H01L 27/3234* (2013.01); *H01L 51/5253* (2013.01); *H01L 51/5281* (2013.01); *H01L 51/5293* (2013.01); *H01L 27/3244* (2013.01); *H01L 51/0097* (2013.01); *H01L 2251/5338* (2013.01)

(58) Field of Classification Search
CPC ......... H01L 51/56; H01L 43/02; H01L 43/10; H01L 43/12; H01L 51/0097
USPC .......................................................... 257/88
See application file for complete search history.

(56) References Cited

U.S. PATENT DOCUMENTS

| | | | |
|---|---|---|---|
| 9,591,765 B2 | 3/2017 | Kim et al. | |
| 2004/0223093 A1 | 11/2004 | Nakayoshi et al. | |
| 2013/0249877 A1 | 9/2013 | Choi et al. | |
| 2014/0055715 A1 | 2/2014 | Lee et al. | |
| 2014/0306941 A1 | 10/2014 | Kim et al. | |
| 2015/0036074 A1* | 2/2015 | Park .................. | G02B 5/30 349/58 |
| 2015/0070614 A1 | 3/2015 | Kim et al. | |
| 2015/0198845 A1 | 7/2015 | Lee et al. | |
| 2015/0227172 A1 | 8/2015 | Namkung et al. | |
| 2015/0309636 A1 | 10/2015 | Kurasawa et al. | |

(Continued)

FOREIGN PATENT DOCUMENTS

| | | |
|---|---|---|
| JP | 2014-168827 A | 9/2014 |
| KR | 10-0626553 B1 | 9/2006 |

(Continued)

*Primary Examiner* — Andy Huynh
(74) *Attorney, Agent, or Firm* — Lewis Roca Rothgerber Christie LLP

(57) ABSTRACT

A display device includes: a substrate; pixels on the substrate; and a polarization film on the pixels and stretched in a first direction and a second direction opposite to the first direction. The polarization film is cut at an end portion of the polarization film along a third direction, the third direction forming an acute angle with the first direction toward an outside of the polarization film.

6 Claims, 12 Drawing Sheets

(56) References Cited

U.S. PATENT DOCUMENTS

2016/0131945 A1* 5/2016 Woo ................. G02F 1/133536
                                                     349/43
2017/0052300 A1* 2/2017 Takeda ................... G02B 5/30
2017/0261668 A1* 9/2017 Hatano ................ G02B 5/3025

FOREIGN PATENT DOCUMENTS

| KR | 10-2014-0055540 A | 5/2014 |
| KR | 10-2014-0086708 A | 7/2014 |
| KR | 10-2015-0080325 A | 7/2015 |

* cited by examiner

DISPLAY DEVICE INCLUDING POLARIZATION FILM

CROSS-REFERENCE TO RELATED APPLICATION

This application is a divisional of U.S. patent application Ser. No. 15/794,927, filed Oct. 26, 2017, which claims priority to and the benefit of Korean Patent Application No. 10-2016-0162964, filed in the Korean Intellectual Property Office on Dec. 1, 2016, the entire contents of both of which are incorporated herein by reference.

BACKGROUND

1. Field

The present invention relates to a display device and a manufacturing method of a display device.

2. Description of the Related Art

An organic light emitting diode display device, which is a self-emissive display device, may be manufactured in a thin shape which does not require a separate light source.

In recent years, various kinds of films have been provided on a front surface or a back surface of the organic light emitting diode display device in order to improve an image quality of the organic light emitting diode display device. All or some of the films are required to be removed, but a process of removal is complicated and byproducts are generated, which degrades display quality.

The above information disclosed in this Background section is only for enhancement of understanding of the background of the invention and therefore it may contain information that does not form prior art.

SUMMARY

Embodiments of the present invention provide a high-quality display device, and a manufacturing method of the same.

Embodiments of the present invention provide a manufacturing method of a display device, including: forming pixels on a mother substrate including a display area and a non-display area; stretching a polarization film in a first direction and a second direction opposite to the first direction on the mother substrate having the pixels thereon; and cutting at least a portion of the polarization film along a third direction, wherein the third direction forms an acute angle with the first direction toward an outside of the polarization film.

In an exemplary embodiment of the present invention, the polarization film may surround the display area and may be cut along a cutting line at the non-display area.

In an exemplary embodiment of the present invention, the display area may have a rectangular shape, and the polarization film may be cut along at least one side of the display area.

In an exemplary embodiment of the present invention, the polarization film may be cut by an ultrasonic wave cutter.

In an exemplary embodiment of the present invention, the manufacturing method may further include cutting at least a portion of the mother substrate to form a substrate, and the mother substrate and the polarization film may be concurrently cut.

In an exemplary embodiment of the present invention, the manufacturing method may further include, before the stretching of the polarization film, attaching an adhesive layer to the pixels on the mother substrate, attaching a protective film to the adhesive layer; forming a cutting groove that penetrates the protective film and has a depth that is less than a thickness of the adhesive layer from a surface of the adhesive layer; removing a portion of the adhesive layer and a portion of the protective film along the cutting groove; inspecting the mother substrate; and removing the protective film.

In an exemplary embodiment of the present invention, the protective film may be cut by an ultrasonic wave cutter, and a thickness of the protective film may be measured by using a laser sensor when the protective film is cut. In an exemplary embodiment of the present invention, the manufacturing method may further include adjusting a depth of the ultrasonic wave cutter depending on the measured thickness.

In an exemplary embodiment of the present invention, the manufacturing method may further include attaching an adhesive layer to a rear surface of the substrate, and attaching a rear surface protective film to the adhesive layer.

In an exemplary embodiment of the present invention, the substrate may have a bendable portion in the non-display area, and the manufacturing method may further include cutting a portion of the rear surface protective film corresponding to the bendable portion.

In an exemplary embodiment of the present invention, the cutting of the portion of the rear surface protective film may include: forming a cutting groove at a portion corresponding to the bendable portion to penetrate the rear surface protective film, the cutting groove having a thickness that is less than a thickness of the adhesive layer from a surface of the adhesive layer; and removing a portion of the adhesive layer and the portion of the rear surface protective film along the cutting groove.

In an exemplary embodiment of the present invention, the rear surface protective film may be cut by using an ultrasonic wave cutter, and the manufacturing method may further include measuring a thickness of the rear surface protective film by using a laser sensor when the rear surface protective film is cut, and adjusting a depth of the ultrasonic wave cutter depending on the measured thickness.

In an exemplary embodiment of the present invention, the manufacturing method may further include forming a camera opening that penetrates an adhesive layer between the pixels and the polarization film and penetrates the polarization film. The forming of the camera opening may include: forming a cutting groove that penetrates the polarization film and has a depth that is less than a thickness of the adhesive layer from a surface of the adhesive layer; and removing a portion of the adhesive layer and a portion of the polarization film along the cutting groove.

Embodiments of the present invention include a display device including: a substrate; pixels on the substrate; and a polarization film on the pixels and stretched in a first direction and a second direction opposite to the first direction, wherein the polarization film is cut at an end portion of the polarization film along a third direction, the third direction forming an acute angle with the first direction toward an outside of the polarization film.

In an exemplary embodiment of the present invention, the display device may include an adhesive layer between the pixels and the polarization film.

In an exemplary embodiment of the present invention, the display device may include a rear surface protective film at a rear surface of the substrate.

In an exemplary embodiment of the present invention, the substrate may include a display area in which the pixels are located, and a non-display area at at least a side of the display area. The substrate may have a bendable portion in the non-display area.

In an exemplary embodiment, the rear surface protective film may be at a portion other than the bendable portion.

In an exemplary embodiment, the display device may include a camera at a rear surface of the substrate, wherein the polarization film has a camera opening at a portion corresponding to the camera.

According to an exemplary embodiment of the present invention, it is possible to manufacture a high-quality display device by being cut without damaging various films (or reducing the likelihood of damage thereto), and thus the display device manufactured according to embodiments of the present invention may provide a high-quality image with fewer defects as compared to existing display devices.

DETAILED DESCRIPTION

Figure 1A:
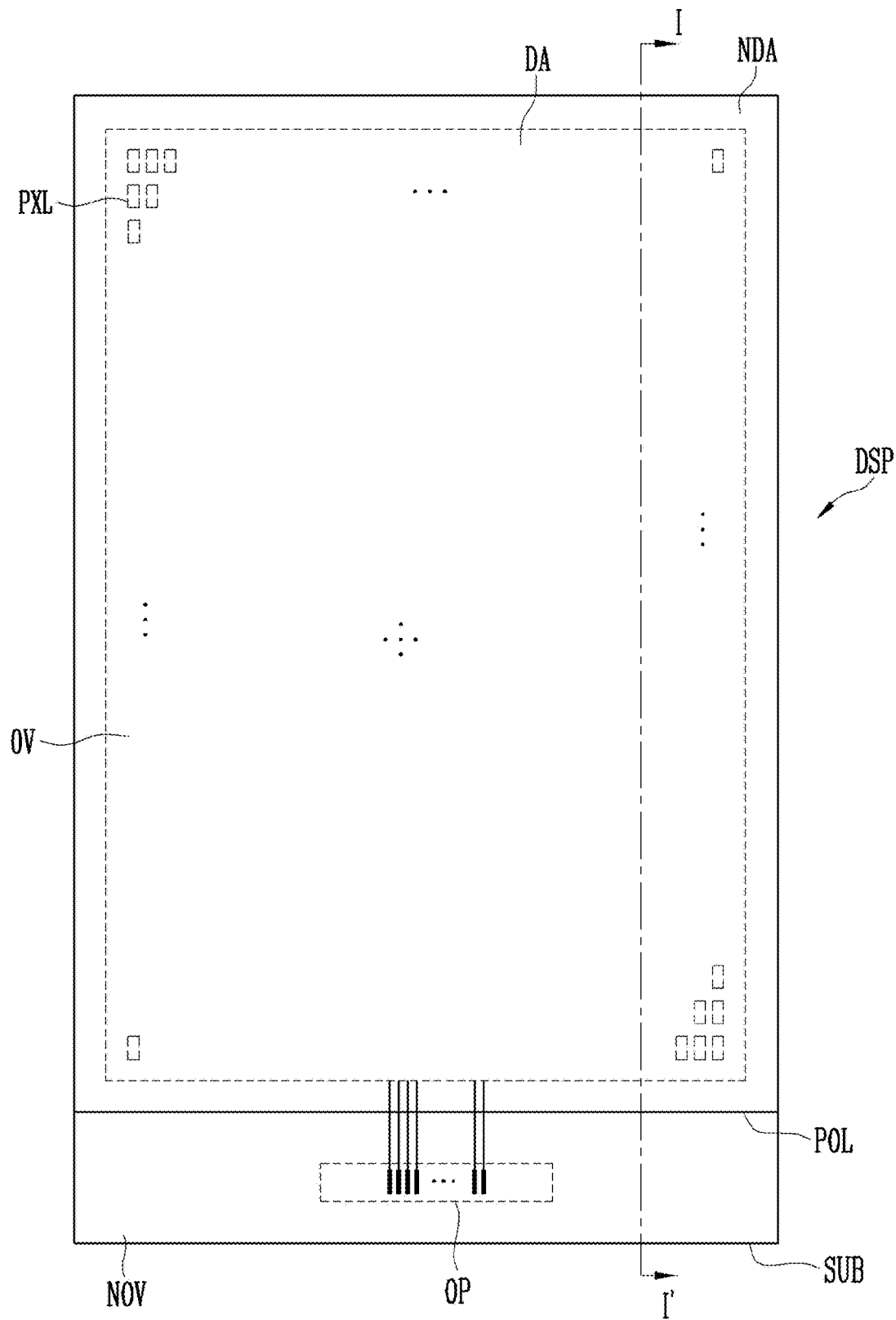
FIG. 1A is a top plan view illustrating a display device according to an exemplary embodiment of the present invention.

Hereinafter, example embodiments will be described in more detail with reference to the accompanying drawings. It will be apparent to those skilled in the art that various modifications and variations can be made in the present invention without departing from the spirit or scope of the invention, and specific exemplary embodiments are exemplified in the drawings and explained in the detailed description. Thus, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described.

Unless otherwise noted, like reference numerals designate like elements throughout the specification. In the drawings, relative sizes and/or thicknesses of layers, films, panels, regions, etc., may be exaggerated for clarity. It will be understood that terms such as "first," "second," and the like may be simply used for description of various constituent elements, but these elements should not be limited by these terms. The above terms are used only for distinguishing one constituent element from other constituent elements. For example, a first constituent element may be referred to as a second constituent element and similarly, the second constituent element may be referred to as the first constituent element within the scope of the appended claims. When explaining the singular, unless explicitly described to the contrary, it may be interpreted as the plural meaning.

Spatially relative terms, such as "lower" and "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," "including," and "has," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

It will be understood that when an element such as a layer, film, region, or substrate is referred to as being "on" or "connected to" another element, it can be directly on or connected to the other element, or intervening elements may also be present.

As used herein, the terms "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." In addition, the use of alternative language, such as "or," when describing embodiments of the present invention, refers to "one or more embodiments of the present invention" for each corresponding item listed. As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, exemplary embodiments of the present invention are described in further detail with reference to the accompanying drawings.

Figure 1B:
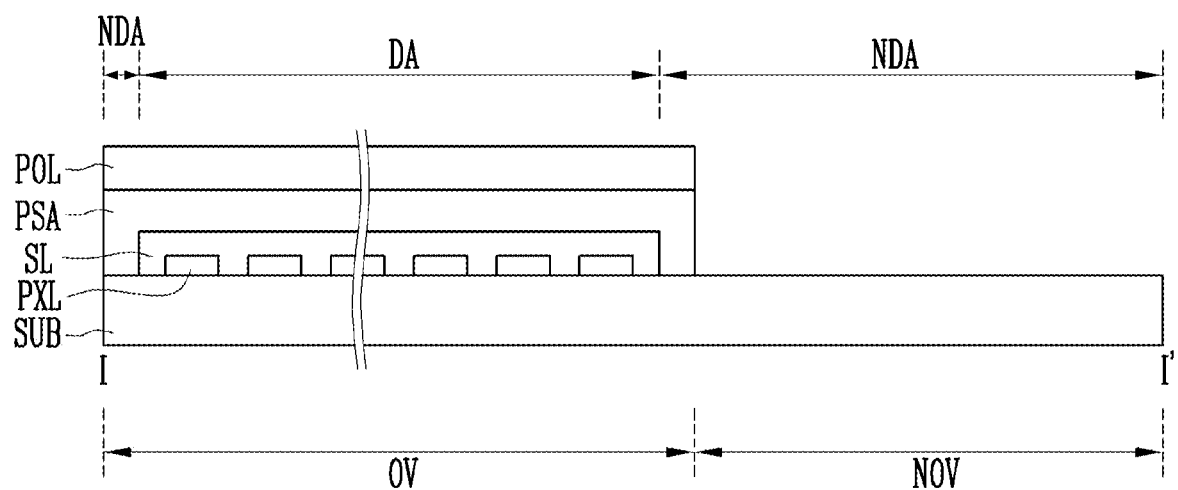
FIG. 1B is a cross-sectional view of the display device of FIG. 1A taken along the line I-I' of FIG. 1A.

FIG. 1A is a top plan view illustrating a display device according to an exemplary embodiment of the present invention, and FIG. 1B is a cross-sectional view taken along the line I-I' of FIG. 1A.

Referring to FIG. 1A and FIG. 1B, the display device DSP according to the present exemplary embodiment includes a display area DA and a non-display area NDA provided around the display area DA.

The display area DA is an area in which images are displayed (or is an area that is configured to display an image), and the images may include arbitrary time information, text, a video, a photograph, a 2D or a 3D image, and the like.

The non-display area NDA is provided around the display area DA. In the present exemplary embodiment, the non-display area NDA may be formed at (or on) at least a side of the display area DA, and may be formed along a periphery of the display area DA. Pad units including pads of wires may be provided in the non-display area NDA. The pad units may be formed at a side of the display area DA.

The display device DSP includes a substrate SUB, pixels PXL on (or disposed on) the substrate SUB, an encapsulation layer SL disposed on the pixels PXL, and a polarization film POL on (or disposed on) the encapsulation layer SL. An adhesive layer PSA may be provided between the encapsulation layer SL and the polarization film POL.

The substrate SUB may be provided in various shapes. For example, the substrate SUB may be provided in a rectangular plate shape having two pairs of sides parallel to each other (or two pairs of parallel sides). When the display device DSP is provided to have the rectangular plate shape, the substrate SUB may be provided such that any one pair of the two pairs of sides is longer than the other pair of sides. For convenience of description, the present exemplary embodiment illustrates an embodiment wherein the display device DSP has a pair of long sides and a pair of short sides.

In the present exemplary embodiment, the polarization film POL may be provided to have an area that is smaller than that of the substrate SUB. When viewed in a plan view, the substrate SUB may have an overlapped portion OV which overlaps with the polarization film POL, and a non-overlapped portion NOV which does not overlap with the polarization film POL.

In the present exemplary embodiment, at least one of the sides of the substrate SUB may coincide with an end portion of the polarization film POL. In the present exemplary embodiment, for example, three sides of the substrate SUB may coincide with an end portion of the polarization film POL, and the other side of the polarization film POL may not coincide with the end portion thereof.

In the present exemplary embodiment, some of the non-display area NDA and the display area DA (or a portion of the non-display area NDA and the display area DA) may be provided in the overlapped portion OV. Some of the non-display area NDA (or a portion of the non-display area NDA) may be provided in the non-overlapped portion NOV.

The non-overlapped portion NOV may be provided at a place (or location) where a flexible printed circuit board, or the like, for connection to an external driver, or the like, is attached (e.g., a place (or location) where a drive pad unit OP is provided). In the present exemplary embodiment, an inspecting pad unit for inspecting whether the pixels or other constituent elements are defective may be provided in the non-overlapped portion NOV of the substrate SUB.

The substrate SUB may be made of a flexible insulating material. The substrate SUB may be made of various suitable materials, such as glass, polymer, metal, and the like. For example, the substrate SUB may be an insulating substrate made of an organic polymer. An example of an insulating substrate material including an organic polymer may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, or the like. However, a material forming the substrate SUB is not limited thereto. For example, the substrate SUB may be made of a fiber glass reinforced plastic.

The pixels PXL may be provided in the display area DA to implement (or provide or generate) an image, and the encapsulation layer SL protects the pixels PXL by encapsulating the pixels PXL.

The encapsulation layer SL may be provided on the pixels PXL to cover the pixels PXL. The encapsulation layer SL may be formed as a single layer or as multiple layers.

In the present exemplary embodiment, the encapsulation layer SL may be made of an organic insulating material and/or an inorganic insulating material. However, a number of layers constituting the encapsulation layer SL or a material thereof is not limited thereto, and may be variously modified. For example, the encapsulation layer SL may include a plurality of organic material layers and a plurality of inorganic material layers which are alternately stacked.

Referring to FIG. 1A and FIG. 1B, the driving pad unit OP is provided to the non-overlapped portion NOV in the non-display area NDA. The driving pad unit OP includes a plurality of driving pads provided at end portions of signal lines. The driving pad unit OP serves to transfer a signal from a driver to the pixels PXL or serves to transfer a signal from the pixels PXL to the driver.

The driving pad unit OP is provided in the non-display area NDA, which is adjacent to at least one of four sides of the substrate SUB. For example, the driving pad unit OP may be provided in a region in which the substrate SUB and the polarization film POL are not overlapped with each other.

In some embodiments, another element (or constituent element), e.g., a flexible printed circuit substrate, may be connected thereto with an additional conductive member therebetween.

The polarization film POL may be provided on the pixels PXL with an adhesive layer PSA therebetween. The polarization film POL prevents reflection of light emitted from an outside, or reduces the likelihood thereof.

The polarization film POL may be as a single layer or a multilayer, and may include a stretched polymer resin layer. The stretched polymer resin layer may include a polyvinyl alcohol-based resin. The polarization film POL may be manufactured by preparing a film made of a polyvinyl alcohol-based resin, stretching it, and dyeing it. The polarization film POL is manufactured through the stretching operation, and thus an orientation of polymers included in the polarization film POL vary depending on a stretching direction.

The adhesive layer PSA may serve to protect the pixels PXL of the substrate SUB and the encapsulation layer SL and to bond the substrate SUB and the polarization film POL. As a result, the adhesive layer PSA may have adhesiveness or adhesion property to perform a bonding function The adhesive layer PSA may be made of a transparent material so as to transmit an image from the pixels PXL. In addition, the adhesive layer PSA may be made of an insulating material, and may be flexible.

A material of the adhesive layer PSA is not limited in its kind. In the present exemplary embodiment, the adhesive layer PSA may be made of an organic material. The organic material, which may be photo-cured or heat-cured, may be selected from various polymer materials. For example, the organic material may include a polymer of an acrylate ester. Alternately, the organic material may include an epoxy resin. An example of the epoxy resin may include a bisphenol A type, a bisphenol F type, a bisphenol AD type, a bisphenol S type, a xylenol type, a phenol novolak type, a cresol novolak type, a polytonic type, a tetraphenylolmethane type, a polyethylene glycol type, a polypropylene glycol type, a hexane diol type, a trimethylol propane type, a propylene oxide bisphenol A type, or a mixture thereof.

The adhesive layer PSA may be provided to expand to not only the display area DA but also the non-display area NDA adjacent to the display area DA. For example, a side of the adhesive layer PSA corresponding to at least one of the sides of the polarization film POL may be exposed to an outside. As a result, another constituent element is not disposed outside the adhesive layer PSA, and a side of the adhesive layer PSA may be disposed at an outermost side.

Figure 2A:
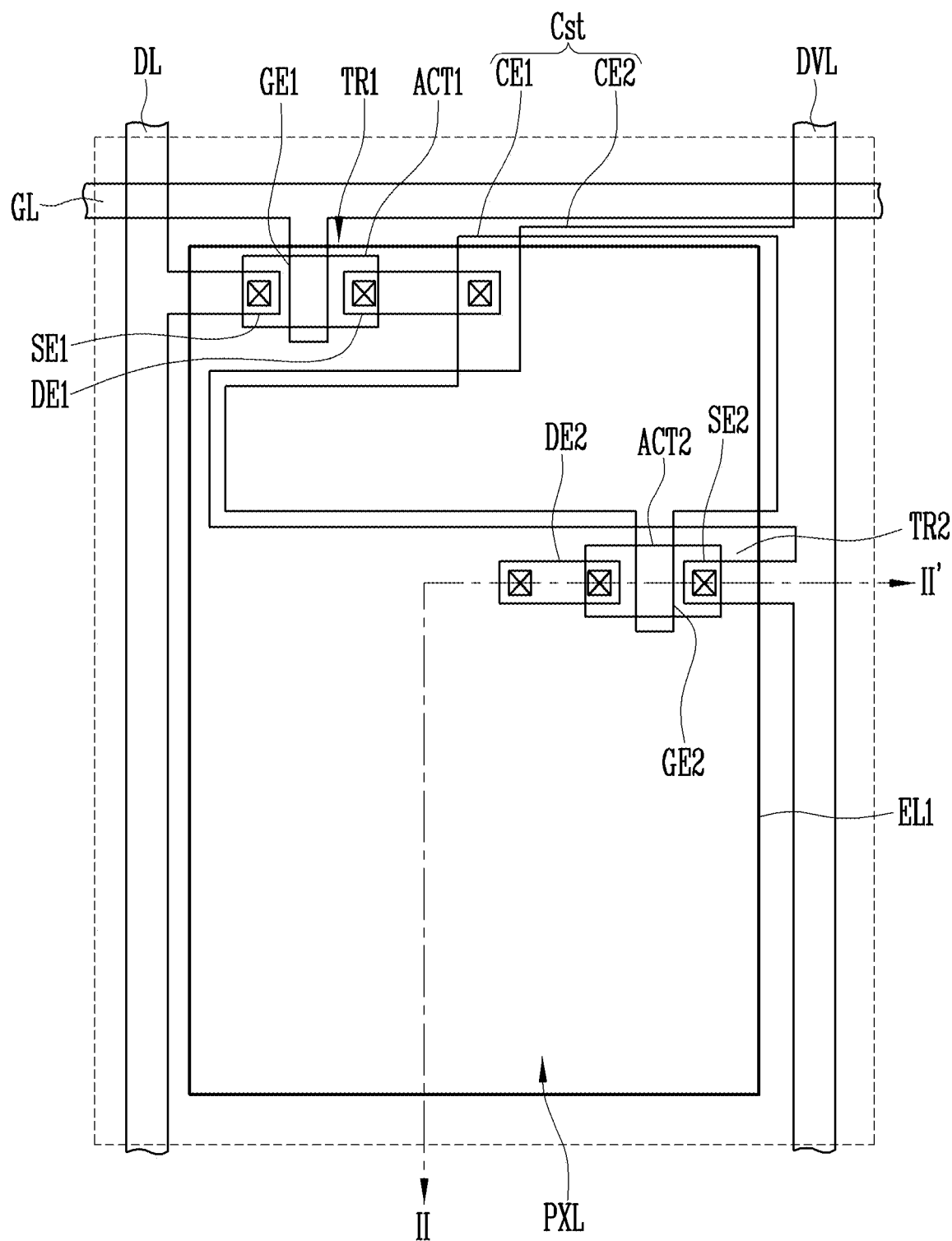
FIG. 2A is a top plan view illustrating a pixel.

Next, each of the pixels is described further. FIG. 2A is a top plan view illustrating a pixel, and FIG. 2B is a cross-sectional view taken along the line II-II' of FIG. 2A.

Figure 2B:
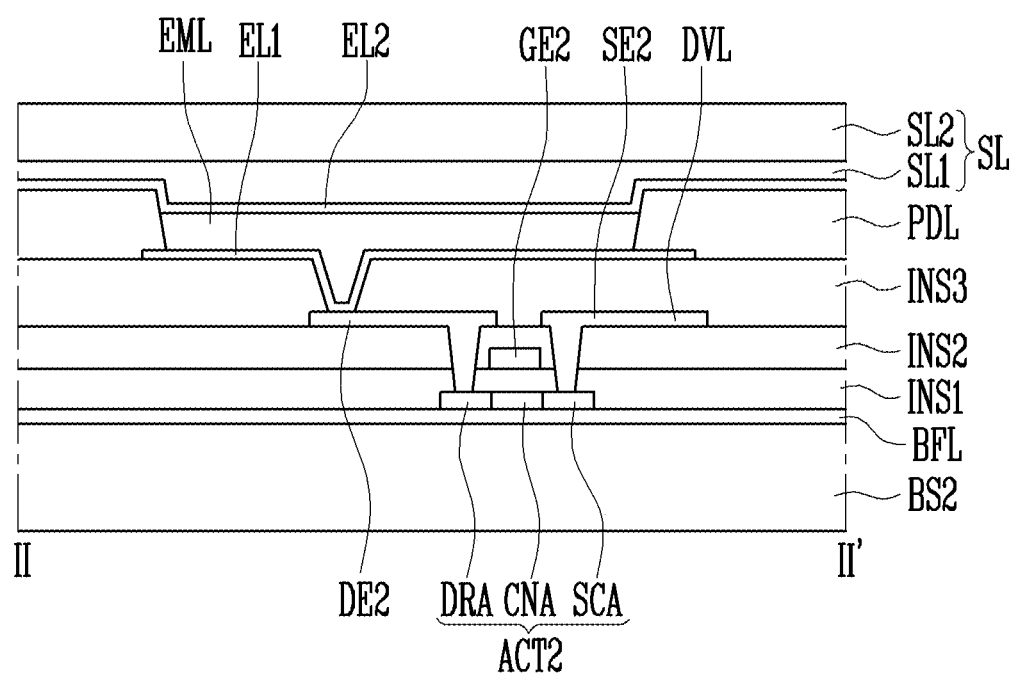
FIG. 2B is a cross-sectional view of the pixel of FIG. 2A taken along the line II-II' of FIG. 2A.

Referring to FIG. 2A and FIG. 2B, the pixels PXL are connected to signal lines. The signal lines may supply signals to each of the pixels PXL, may include gate lines GL, data lines DL, and driving voltage lines DVL, and may further include other wires as necessary.

The gate lines GL may extend in a direction (e.g., in a first direction). The data lines DL may extend in a direction (e.g., a second direction) crossing the gate lines GL. The driving voltage line DVL may extend in substantially a same direction as that of the data lines DL. The gate lines GL transfer scanning signals to a thin film transistor, the data lines DL transfer data signals to the thin film transistor, and the driving voltage line DVL transfers a driving voltage to the thin film transistor.

A plurality of gate lines GL, data lines DL, and driving voltage lines DVL are provided.

Each of the signal lines is provided over (or on or at) the display area DA and the non-display area NDA.

The pixels PXL display images (or are configured to display images), and are provided in the display area DA. A plurality of pixels PXL may be provided, and may be arranged in a matrix form. In the present exemplary embodiment, one pixel PXL is illustrated in FIG. 2A and FIG. 2B for convenience. Herein, each of the pixels PXL is illustrated to have a rectangular shape, but the present invention is not limited thereto. Each of the pixels PXL may be modified in various forms. In addition, the pixels PXL may be provided to have different areas. For example, when the pixels PXL have different colors, the pixels PXL may be provided in different areas or different shapes for the respective colors.

Each of the pixels PXL includes a thin film transistor corresponding to one of the signal lines, a light-emitting element connected with the thin film transistor, and a capacitor Cst.

The thin film transistor may include a driving thin film transistor TR2 for controlling the light-emitting element, and a switching thin film transistor TR1 for switching the driving thin film transistor TR2. In the present exemplary embodiment, one pixel PXL is described to include two thin film transistors TR1 and TR2, but it is not limited thereto. The pixel PXL may include one thin film transistor and one capacitor for one pixel PXL, or may include three or more thin film transistors and two or more capacitors.

The switching thin film transistor TR1 includes a first gate electrode GE1, and a first source electrode SE1 and a first drain electrode DE1. The first gate electrode GE1 is connected with the gate line GL, and the first source electrode SE1 is connected with the data line DL. The first drain electrode DE1 is connected with a gate electrode (e.g., a second gate electrode GE2) of the driving thin film transistor TR2. The switching thin film transistor TR1 transfers a data signal applied to the data line DL to the driving thin film transistor TR2 depending on a scanning signal applied to the gate line GL.

The driving thin film transistor TR2 includes the second gate electrode GE2, a second source electrode SE2, and a second drain electrode DE2. The second gate electrode GE2 is connected with the switching thin film transistor TR1, the second source electrode EL2 is connected with the driving voltage line DVL, and the second drain electrode DE2 is connected with the light-emitting element.

The light-emitting element includes an emission layer EML, and a first electrode EL1 and a second electrode EL2 which face each other with the emission layer EML therebetween. The first electrode EL1 is connected with the second drain electrode DE2 of the driving thin film transistor TR2. A common voltage is applied to the second electrode EL2, and the emission layer EML displays images by controlling light emission depending on an output signal of the driving thin film transistor TR2. Herein, light emitted from the emission layer EML may be modified depending on a material of the emission layer to emit color light and/or white light.

The capacitor Cst is connected between the second source electrode SE2 and the second gate electrode GE2 of the driving thin film transistor TR2 to charge and maintain a data signal inputted into the second gate electrode GE2 of the driving thin film transistor TR2.

Hereinafter, pixels PXL according to an exemplary embodiment of the present invention are described depending on a stacked order.

The pixels PXL according to the present exemplary embodiment are provided on the substrate SUB.

A buffer layer BFL is formed on the substrate SUB. The buffer layer BFL prevents impurities from diffusing into the switching and driving thin film transistors TR1 and TR2, or reduces the likelihood thereof. The buffer layer BFL may be made of, e.g., silicon nitride (SiNx), silicon oxide (SiOx), or silicon oxynitride (SiOxNy), and may be omitted depending on material and process conditions of the substrate SUB.

A first active pattern ACT1 and a second active pattern ACT2 are provided on the buffer layer BFL. The first active pattern ACT1 and the second active pattern ACT2 may be made of a semiconductor material Each of the first active pattern ACT1 and the second active pattern ACT2 includes a source region SA, a drain region DA, and a channel region CA disposed between the source region SA and the drain region DA. The first active pattern ACT1 and the second active pattern ACT2 may be a semiconductor pattern made of polysilicon, amorphous silicon, oxide semiconductor, or the like. For example, the channel region CA may be an intrinsic semiconductor as a semiconductor pattern which is not doped with an impurity. The source region SA and the drain region DA may be a semiconductor pattern doped with the impurity. Impurities such as n-type impurities, p-type impurities, and other metals may be doped.

A first insulating layer INS1 is provided on the first active pattern ACT1 and the second active pattern ACT2.

The first gate electrode GE1 and the second gate electrode GE2 connected with the gate line GL are provided on the first insulating layer INS1. Each of the first gate electrode GE1 and the second gate electrode GE2 are formed to cover regions corresponding to the channel regions CA of the first active pattern ACT1 and the second active pattern ACT2.

A second insulating layer INS2 is provided on the first and second gate electrodes GE1 and GE2 to cover the first and second gate electrodes GE1 and GE2.

A first source electrode SE1 and a first drain electrode DE1, and the second source electrode SE2 and the second drain electrode DE2 are provided on the second insulating layer INS2. The first source electrode SE1 and the first drain electrode DE1 respectively contact the source region SA and the drain region DA of the first active pattern ACT1 through contact holes formed in the first insulating layer INS1 and the second insulating layer INS2. The second source electrode SE2 and the second drain electrode DE2 respectively contact the source region SA and the drain region DA of the second active pattern ACT2 through openings (e.g., contact holes) formed in the first insulating layer INS1 and the second insulating layer INS2.

Meanwhile, a portion of the second gate electrode GE2 and a portion of the driving voltage line DVL respectively serve as a first capacitor electrode CE1 and a second capacitor electrode CE2, which together constitute (or form) the capacitor Cst with the second insulating layer INS2 disposed therebetween.

A third insulating layer INS3 is provided on the first source electrode SE1, the first drain electrode DE1, the second source electrode SE2, and the second drain electrode DE2. The third insulating layer INS3 may serve as a passivation layer for protecting the switching and driving thin film transistors TR1 and TR2, and may serve as a planarization layer for planarizing an upper surface thereof.

The first electrode EL1 as an anode of the light-emitting element is provided on the third insulating layer INS3. The first electrode EL1 is connected with the second drain electrode DE2 of the driving thin film transistor TR2 through an opening (e.g., a contact hole) formed on the third insulating layer INS3. In some embodiments, the first electrode EL1 may be used as a cathode. However, for convenience of description, an exemplary embodiment wherein the first electrode EL1 serves as the anode is described below.

The first electrode EL1 may be made of a material having a high work function. In some embodiments, when an image is provided in a lower direction of the substrate SUB, the first electrode EL1 may be made of a transparent conductive film such as ITO (indium tin oxide), IZO (indium zinc oxide), ZnO (zinc oxide), or ITZO (indium tin zinc oxide). In some embodiments, when an image is provided in an upper direction of the substrate SUB, the first electrode EL1 may be made of a metal reflective layer such as Ag, Mg, Al, Pt, Pd, Au, Ni, Nd, Ir, or Cr and a transparent conductive film such as ITO (indium tin oxide), IZO (indium zinc oxide), ZnO (zinc oxide), or ITZO (indium tin zinc oxide).

A pixel definition layer PDL is provided on the substrate SUB formed in the first electrode EL1 to define pixel areas to correspond to each pixel PXL. The pixel definition layer PDL is exposed to an upper surface of the first electrode EL1, and protrudes from the substrate SUB along a periphery of the pixel PXL.

The emission layer EML is provided on the pixel areas surrounded by the pixel definition layer PDL, and the second electrode EL2 is provided on the emission layer EML.

The display device having the aforementioned structure may be manufactured by forming pixels on the display areas of the substrate including the display area DA and the non-display area NDA, attaching the stretched polarization film in opposite directions, and cutting at least a portion of the polarization film.

Figure 3:
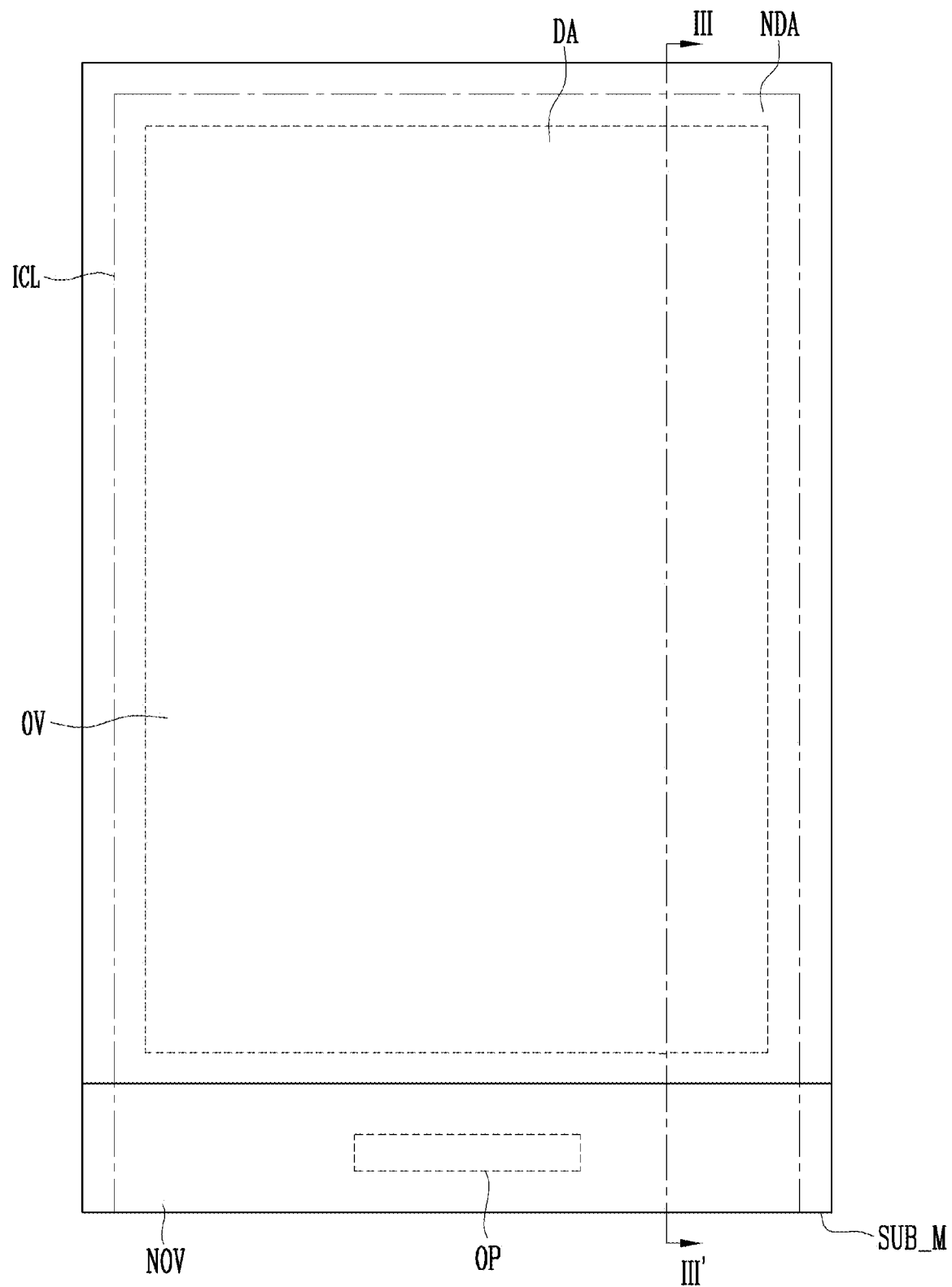
FIG. 3 is a top plan view illustrating a mother substrate for manufacturing a display device according to an exemplary embodiment of the present invention.

FIG. 3 is a top plan view illustrating a mother substrate for manufacturing a display device according to an exemplary embodiment of the present invention, and FIGS. 4A-4F are cross-sectional views corresponding to the line III-III' of FIG. 3, sequentially illustrating a method of manufacturing a display device according to an exemplary embodiment of the present invention.

Referring to FIG. 3, a substrate that is greater than a final display device to be obtained is provided (or a substrate having a size that is greater than a size of a final display device to be obtained is provided). The substrate may be cut in (or to) a desired size. In a following exemplary embodiment, the substrate before being cut is referred to as a mother substrate SUB_M. In the mother substrate SUB_M, the non-display area NDA may be provided to have a wider area (or a larger area) than that of the final substrate SUB, a virtual cutting line ICL along which the cutting is performed is defined (or formed) in the widely provided non-display area NDA. FIG. 3 illustrates one display element that is formed on one mother substrate SUB_M, but the present invention is not limited thereto. For example, according to another exemplary embodiment, a plurality of display elements may be formed on one mother substrate SUB_M. The cutting line ICL surrounds the display area DA, and is provided in the non-display area NDA.

Figure 4A:
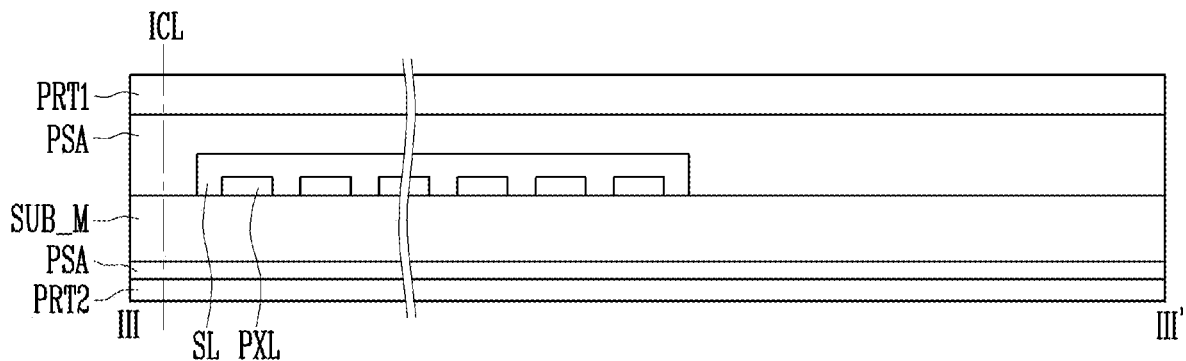
FIGS. 4A-4F are cross-sectional views corresponding to the line III-III' of FIG. 3, sequentially illustrating a method of manufacturing a display device according to an exemplary embodiment of the present invention.

Referring to FIG. 3 and FIG. 4A, the pixels PXL and the encapsulation layer SL are formed on the mother substrate SUB_M. The pixels PXL and the encapsulation layer SL may be manufactured using photolithography (e.g., a plurality of times of photolithography).

The adhesive layer PSA is formed on the encapsulation layer SL, and a protective film PRT1 is attached on (or to) the adhesive layer PSA. The protective film PRT1 serves to protect the pixels PXL and other elements from being damaged in the process of transferring/delivering a manufactured product.

In the present exemplary embodiment, a rear surface protective film PRT2 may be attached on a rear surface of the mother substrate SUB_M with an adhesive layer PSA therebetween. The rear surface protective film PRT2 may also protect the mother substrate SUB_M and the like by covering the rear surface of the mother substrate SUB_M.

The protective film PRT1 is required to be removed such that an inspecting pad unit is exposed in order to inspect whether the pixels PXL and other constituent elements are defective.

Figure 4B:
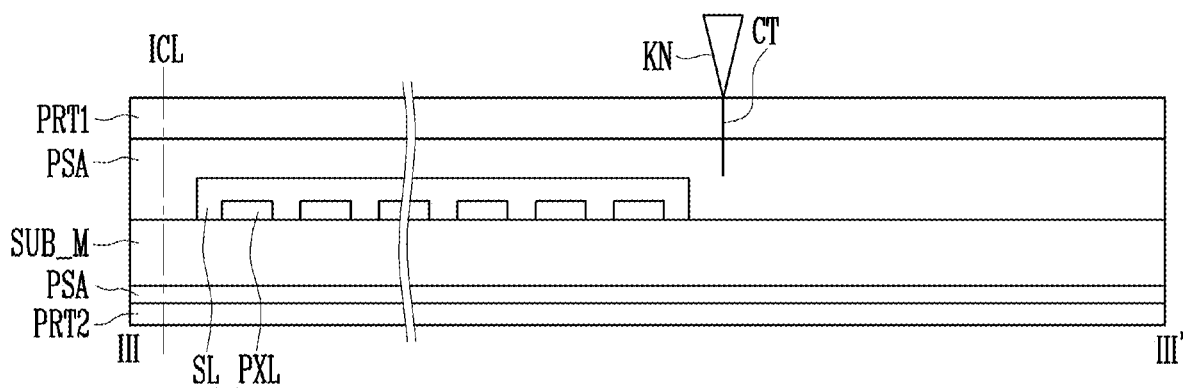

Referring to FIG. 4B, a cutting groove CT is formed in at least part of the adhesive layer PSA and the protective film PRT1.

Thereafter, the cutting groove CT for removing the protective film PRT1 and the adhesive layer PSA, corresponds to a boundary where the protective film PRT1 and the adhesive layer PSA are removed, and serves as a guide line at the time of removal. The cutting groove CT penetrates (e.g., completely penetrates) the protective film PRT1, and has a predetermined depth in a lower direction from an upper surface of the adhesive layer PSA. The depth of the cutting groove CT may be provided to have an appropriate thickness such that the adhesive layer PSA can be removed (or removed easily or removed well) when the protective film PRT1 and the adhesive layer PSA are removed. The cutting groove CT is formed such that the depth is smaller than the thickness, i.e., the cutting groove CT does not penetrate the adhesive layer PSA. The depth of the cutting groove CT from the upper surface of the adhesive layer PSA may have a value corresponding to (or equal to) ⅓ to ⅔ of the thickness of the adhesive layer PSA.

The protective film PRT1 and the adhesive layer PSA may be cut by using an ultrasonic wave cutter KN, for example.

When the protective film PRT1 is cut by using the ultrasonic wave cutter KN, the mother substrate SUB_M on which the protective film PRT1 is attached may be disposed on a stage, and may be cut from a start point (or a point adjacent to an end point, e.g., a dummy portion) to the end portion by using the ultrasonic wave cutter KN.

The mother substrate SUB_M may have an identification mark for alignment and may be accurately aligned on the stage by sensing the identification mark. The aligned mother substrate SUB_M may be fixed on the stage by vacuum suction. A groove or a dummy film for protecting the ultrasonic wave cutter KN may be additionally provided on the stage.

The ultrasonic wave cutter KN includes a vibrator and a cutter that may vibrate at several tens of Khz. The cutter is attached to the vibrator, has a displacement of several tens of microns due to the vibration of the vibrator, and vibrates up and down. The cutter contacts the mother substrate SUB_M to perform the cutting, and vertical vibration of the cutter generates a tensile stress locally strong to the mother substrate SUB_M, thereby minimizing damage to a cut portion.

At least one of the ultrasonic wave cutter KN and the stage may move in order to perform the cutting in a direction. For example, the ultrasonic wave cutter KN may move in a state where the stage is fixed, or the mother substrate SUB_M may move in a state where the ultrasonic wave cutter KN is fixed. For convenience of description, in the present exemplary embodiment, the cutting may be performed in a way that the ultrasonic wave cutter KN moves. For example, the movement of the ultrasonic wave cutter KN may be controlled by fixing the ultrasonic wave cutter KN to a gentry type of robot for facilitating position control and angle control.

An upper surface of the protective film PRT1 may be positioned horizontally with respect to the cutting direction in order to prevent wrong movement of a blade when the protective film PRT1 is cut.

In the present exemplary embodiment, a position of the ultrasonic wave cutter KN may be controlled by using a laser sensor in order to precisely adjust a depth of the cutting groove CT. After a laser sensor is disposed adjacent to the ultrasonic wave cutter KN, a thickness of the protective film PRT1 and/or a thickness of the adhesive layer PSA may be measured to control vertical movement of the ultrasonic wave cutter KN based on (or according to) the measured thickness. As a result, the laser sensor may control a height of the ultrasonic wave cutter KN by measuring a surface height of the protective film PRT1, and the like, caused by flatness of the stage and thickness tolerance of each constituent element, and the like, and by feeding back the measured value to the ultrasonic wave cutter KN. The laser sensor may be attached to the ultrasonic wave cutter KN to move simultaneously with the ultrasonic wave cutter KN.

Figure 4C:
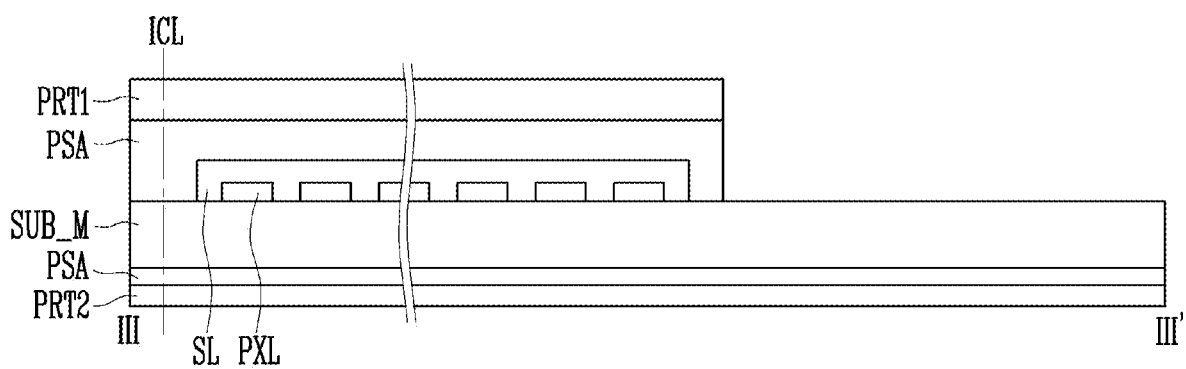

Next, referring to FIG. 4C, a portion of adhesive layer PSA and a portion of the protective film PRT1 are removed along the cutting groove CT.

The adhesive layer PSA and the protective film PRT1 are located at the side where no display area is provided among the protective films PRT1 disposed at opposite sides with respect to the cutting groove CT. Accordingly, the protective film PRT1 remains at the overlapped portion only, but no protective film PRT1 is provided at the non-overlapped portion.

The pixels PXL and/or other constituent elements may be inspected to check if the pixels PXL and/or other constituted elements are defective by using the non-overlapped portion from which the protective film PRT1 is removed. In the inspection, the inspecting pad unit provided to the non-overlapped portion may be utilized.

Figure 4D:
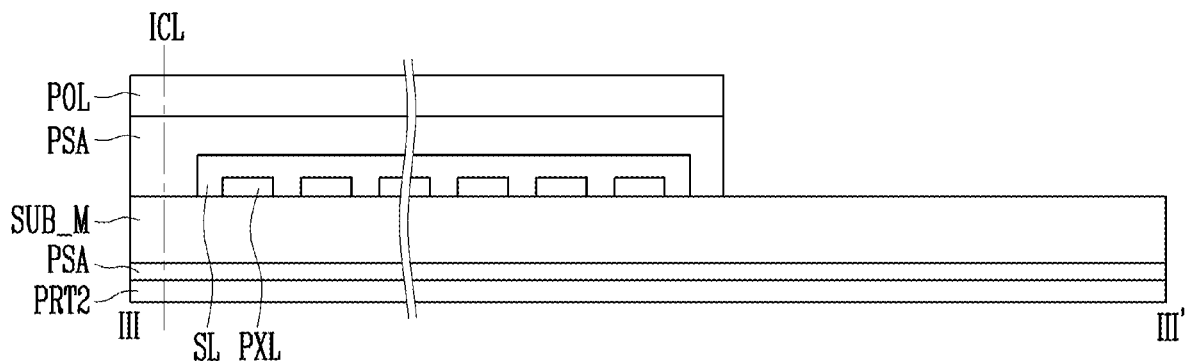

Referring to FIG. 4D, after inspecting whether the pixels PXL and/or other constituent elements are defective, the adhesive layer PSA and the protective film PRT1 remaining in the overlapped portion are removed, and the polarization film POL is attached thereon with the adhesive layer PSA therebetween. The polarization film POL is attached to (or at) a position at which the protective film PRT1 is removed. Accordingly, the polarization film POL is provided to the overlapped portion OV only, and no polarization film POL is provided in the non-overlapped portion NOV.

Figure 4E:
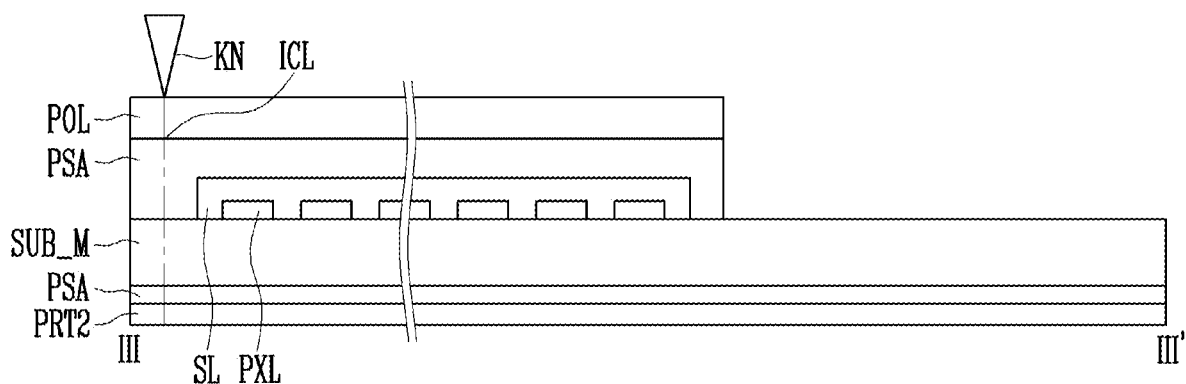

Referring to FIG. 4E, at least a portion of the polarization film POL and at least portion of the mother substrate SUB_M are cut. The polarization film POL and the mother substrate SUB_M may be cut (e.g., simultaneously cut or concurrently cut) at the cutting line ICL. For example, a cut portion of the polarization film POL and a cut portion of the mother substrate SUB_M may correspond to the cutting line ICL. An end portion of the polarization film POL and an end portion of the mother substrate SUB_M coincide with each other in a plan view when the polarization film POL and the mother substrate SUB_M are cut (or simultaneously cut or concurrently cut).

The polarization film POL and the mother substrate SUB_M may be cut by using the ultrasonic wave cutter KN. Herein, the ultrasonic wave cutter KN may be provided in an upper portion of the polarization film POL, or may be provided to the mother substrate SUB_M. For convenience of description, in the present exemplary embodiment, it is illustrated that the ultrasonic wave cutter KN may be provided in the upper portion of the polarization film POL.

Steps of cutting the polarization film POL and the mother substrate SUB_M are described further below.

Figure 4F:
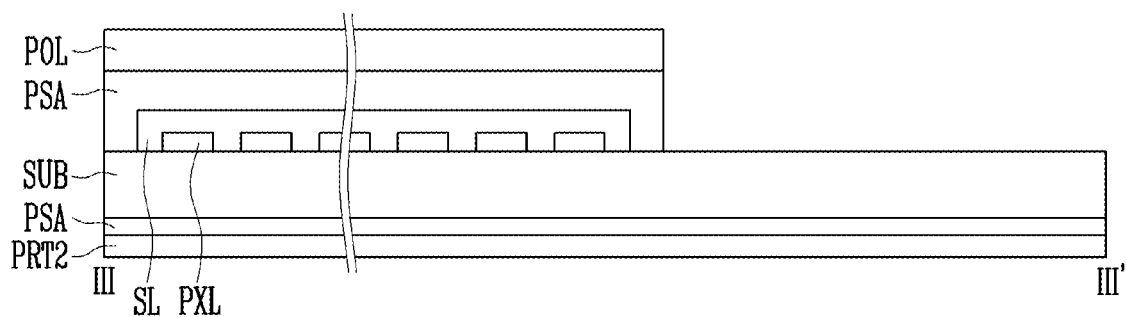

Referring to FIG. 4F, a display device in which the polarization film POL is provided on the substrate SUB is manufactured by cutting the polarization film POL and the mother substrate SUB_M.

Figure 5:
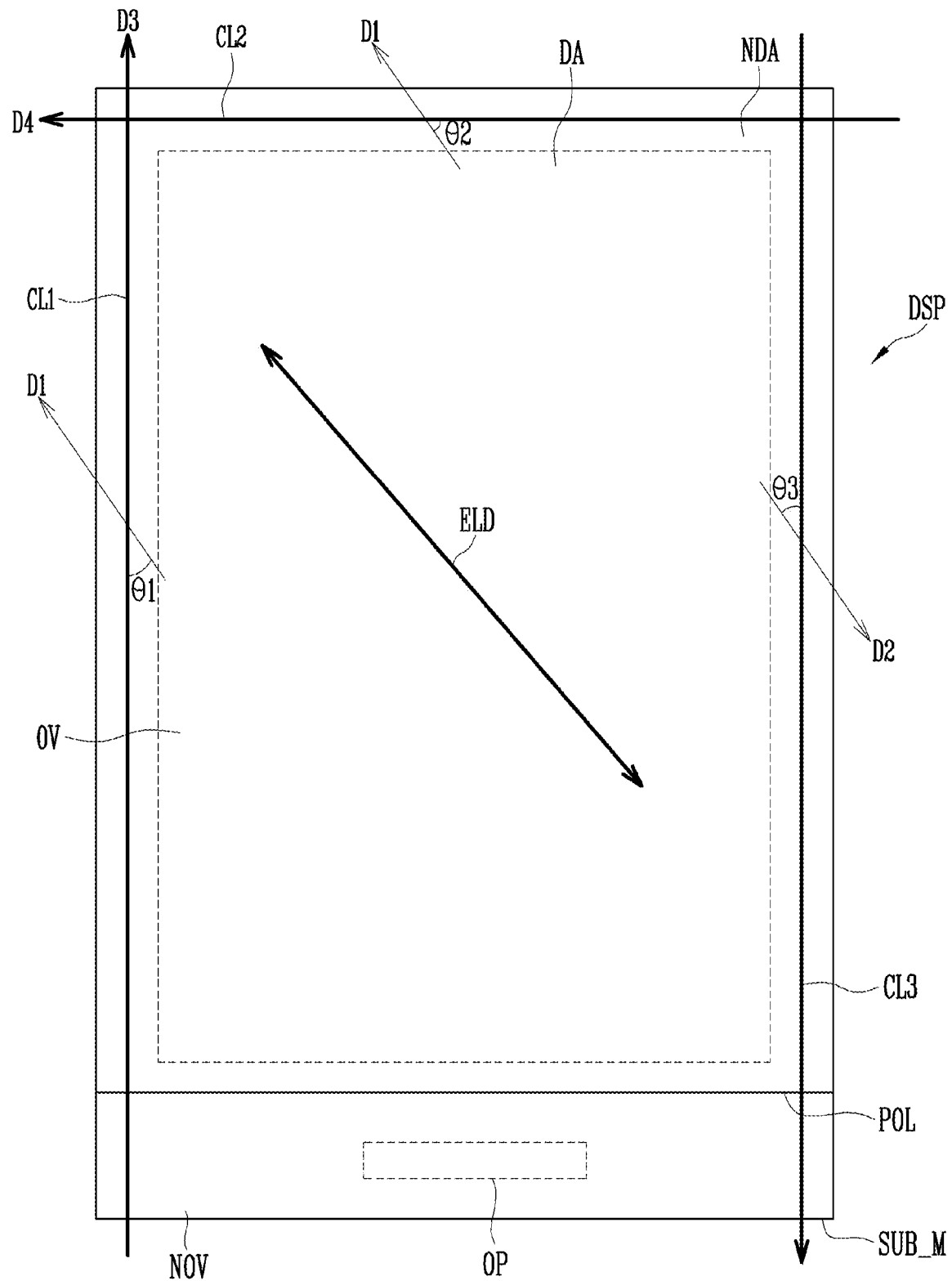
FIG. 5 is a top plan view of a mother substrate for describing a method of cutting a polarization film.

FIG. 5 is a top plan view of a mother substrate for describing a method of cutting a polarization film.

In the present exemplary embodiment, the polarization film POL and the mother substrate SUB_M may be simultaneously cut by using the ultrasonic wave cutter. The ultrasonic wave cutter moves along a direction (or a specific direction) in consideration of an elongation direction ELD of the polarization film POL. Hereinafter, a method of cutting the polarization film POL based on the elongation direction ELD by using the ultrasonic wave cutter is described.

Referring to FIG. 5, the polarization film POL is attached on (or to) the mother substrate SUB_M.

The mother substrate SUB_M may be provided to have a rectangular shape including a pair of short sides and a pair of long sides, and includes the overlapped portion OV in which the polarization film POL is provided and the non-overlapped portion NOV in which no polarization film POL is provided. The display area DA may be disposed in the overlapped portion OV, and the display area DA may also be provided to have a rectangular shape.

The polarization film POL is uniaxially stretched in opposite directions. For example, when one of the opposite directions is referred to as a first direction D1 and the other thereof is referred to as a second direction D2, the first direction D1 and the second direction D2 are opposite to each other. The elongation direction ELD of the polarization film POL may be inclined with respect to an extending direction of the long or short sides of the mother substrate SUB_M. For convenience of description, when the extending direction of the pair of long sides is referred to as a third direction D3 and the extending direction of the pair of short sides is referred to as a fourth direction D4, the first and second directions D1 and D2 may be inclined with respect to the third and fourth directions D3 and D4.

The cutting line ICL (see, e.g., FIG. 3) is provided along the periphery of the display area DA. The cutting line ICL may be variously changed depending on the shape of the display area DA. According to the present exemplary embodiment, the cutting line ICL may include a first cutting line CL1 extended in the long-side direction (or the third direction D3), a second cutting line CL2 extended in the short-side direction (or the fourth direction D4), and a third cutting line CL3 extended in the long-side direction (or the third direction D3), along the sides of the display area sequentially disposed.

The polarization film POL may be cut by using the aforementioned ultrasonic wave cutter in such a manner that the polarization film POL is moved along the first cutting line CL1, the second cutting line CL2, and the third cutting line CL3. In the present exemplary embodiment, when the ultrasonic wave cutting is performed, it is possible to adjust a depth of the ultrasonic wave cutter KN by using a laser sensor, for example.

In the present exemplary embodiment, the polarization film POL is cut in a specific direction in which damage thereto is minimized or reduced. When the polarization film POL is damaged, a crack may be generated at a surface (or a cut surface) of the polarization film POL and in its vicinity, and the crack may propagate into the polarization film POL, which leads to deterioration of image quality.

In the polarization film POL, a polyvinyl alcohol-based resin having a polarizing function has directionality through stretching. When the cutting direction is a backward direction of an alignment direction of the polyvinyl alcohol-based resin or is close to the opposite direction, the polyvinyl alcohol-based resin may be damaged. When the cutting direction is a forward direction of the alignment direction of the polyvinyl alcohol-based resin or is close to the forward direction, the damage to the polyvinyl alcohol-based resin may be minimized.

A traveling direction from a start point to an end point of the ultrasonic wave cutter, e.g., a direction in which the cutting is performed, may be an acute angle with a direction toward the outside of the polarization film POL among the stretched directions in order to reduce or minimize damage of the polarization film POL. Referring to FIG. 5, each start point and each end point are exemplarily illustrated.

For example, for the first cutting line CL1 that extends in the long-side direction, a direction toward the outside among the elongation direction ELD of the polarization film POL is the first direction D1 in a region corresponding to the first cutting line CL1.

The cutting is performed in a direction that makes an acute angle with the first direction D1, e.g., in the third direction D3, in order to perform the cutting in the forward direction at a maximum while conforming to the first cutting line CL1. As illustrated therein, the first direction D1 and the third direction D3 form an acute angle θ1.

A backward direction of the third direction D3 forms an obtuse angle with the first direction D1. When the polarizing film POL is cut along the first cutting line CL1, the polarization film POL may be damaged because the first cutting line CL1 is close to the direction opposite to the alignment direction of the resin.

Similarly, in a region corresponding to the second cutting line CL2 that extends in the short-side direction (or the fourth direction D4), the elongation direction ELD extends in a direction outside of the polarization film POL toward the first direction D1. The cutting is performed in a direction that makes an acute angle with the first direction D1, e.g., in the fourth direction D4, in order to perform the cutting in the forward direction at a maximum while conforming to the second cutting line CL2. As illustrated in FIG. 5, the first direction D1 and the fourth direction D4 form an acute angle θ2 with each other.

A backward direction of the fourth direction D4 forms an obtuse angle with the first direction D1. When the cutting is performed along the first cutting line CL1, the polarization film POL may be damaged because the backward direction is close to a direction opposite to the alignment direction of the resin.

Similarly, in a region corresponding to the third cutting line CL3 that extends in the long-side direction (or the third direction D3), the elongation direction ELD extends in a direction outside of the polarization film POL toward the second direction D2. The cutting is performed in a direction that makes an acute angle with the second direction D2, e.g., the third direction D3, in order to perform the cutting in the forward direction at the maximum while conforming to the third cutting line CL3. As illustrated in FIG. 5, the second direction D2 and a backward direction of the third direction D3 form an acute angle 83 with each other.

The third direction D3 forms an obtuse angle with the second direction D2. When the cutting is performed along the second cutting line CL2, the polarization film POL may be damaged because the third direction D3 is close to the direction opposite to the alignment direction of the resin.

Figure 6A:
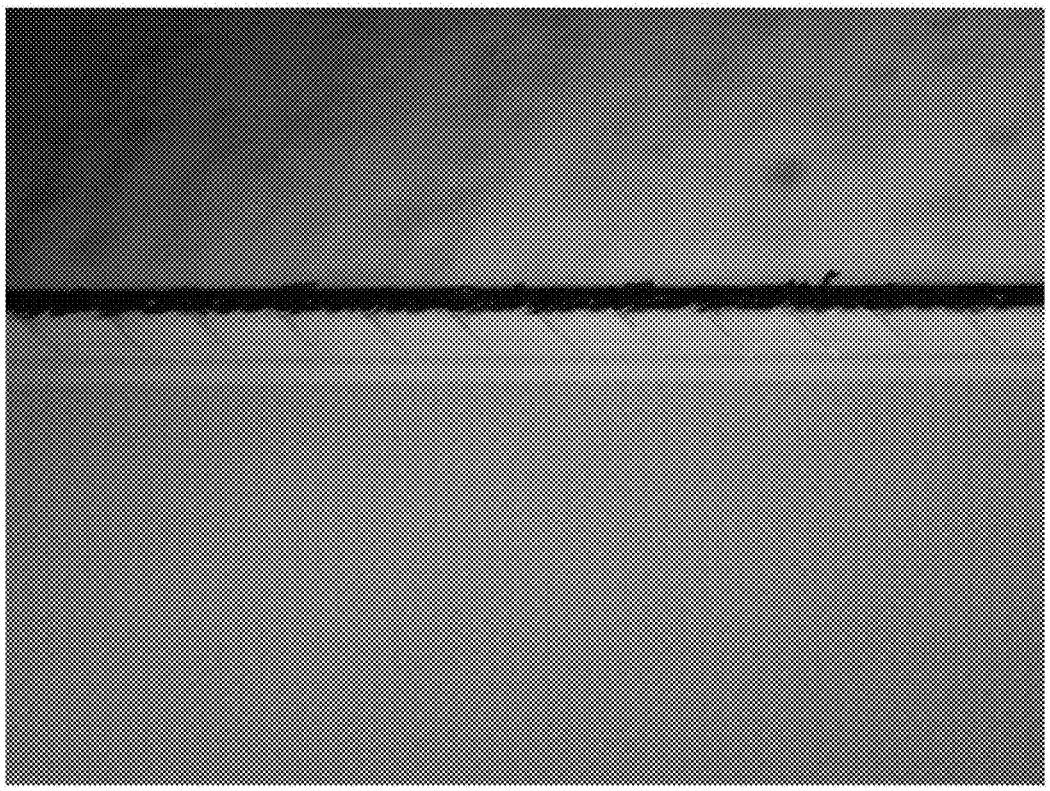
FIG. 6A is a photograph illustrating a cross-section of a display device wherein cutting is performed in a backward direction of an elongation direction.
Figure 6B:
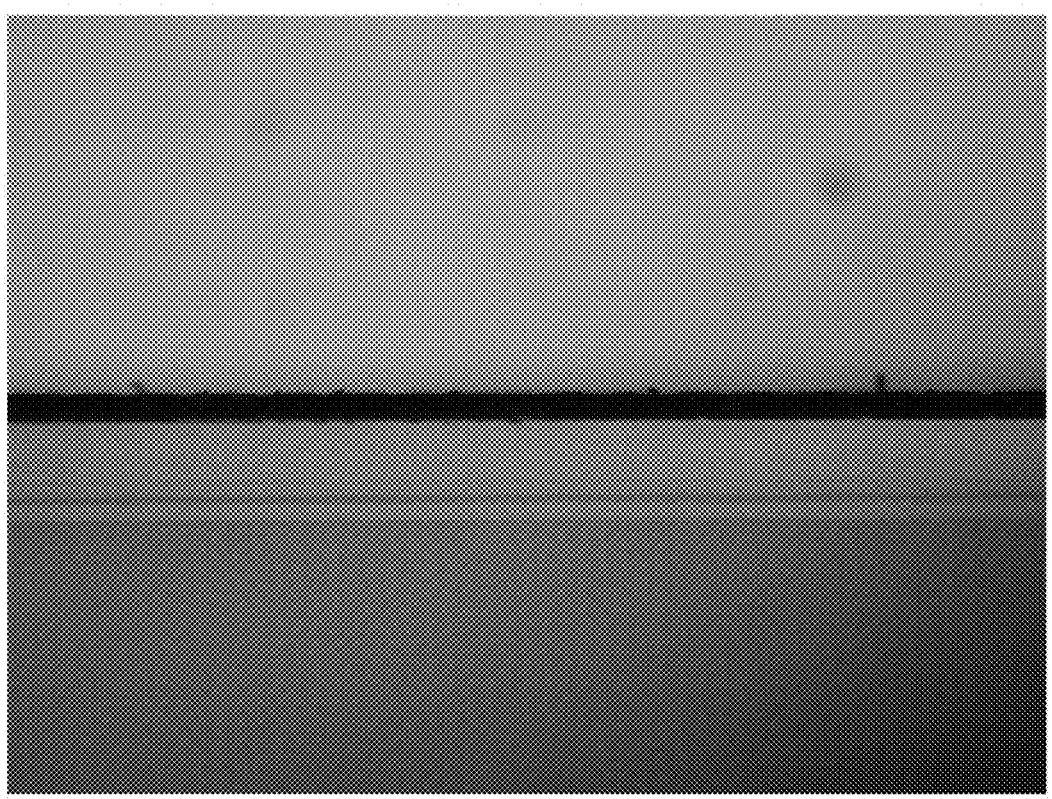
FIG. 6B is a photograph illustrating a cross-section of a display device wherein cutting is performed in a forward direction of an elongation direction.

FIG. 6A is a photograph illustrating a cross-section of a display device wherein cutting is performed in a backward direction of the elongation direction, and FIG. 6B is a photograph illustrating a cross-section of a display device wherein cutting is performed in a forward direction of the elongation direction.

Referring to FIG. 6A, it can be seen that a crack was formed in an oblique direction on a cross section of the polarization film POL. Referring to FIG. 6B, it can be seen that the cross section of the polarization film POL was cleanly cut without cracks (or without many cracks).

As described above, when the cutting direction is maintained as a specific direction depending on the elongation direction of the polarization film POL in consideration of (or according to) the elongation direction of the polarization film POL, damage of the polarization film POL may be reduced (or minimized), thereby obtaining high-quality images.

In addition, the cutting method of the polarization film according to the present exemplary embodiment has various features or benefits, as compared with a conventional cutting process using a laser.

The conventional cutting process using the laser has problems of quality deterioration due to byproducts (e.g., carbide, fume, and/or dust) generated during laser machining. The fume or dust may contaminate laser optics or surrounding environments, and carbides, especially after cutting metal terminals, may cause electrical shorts (or electrical short circuits).

However, in the cutting process according to the present exemplary embodiment, there is no (or little) by-product generated during processing by using an ultrasonic wave cutter. Accordingly, no additional process is required to remove the carbide, and continuous maintenance is possible by simply replacing the ultrasonic cutter.

The conventional cutting process using the laser has difficulty in achieving uniform quality because the laser wavelength absorption of a material to be cut is different, while the cutting process according to the present embodiment has little restriction on the single/multi-layer material by utilizing the ultrasonic cutter.

In addition, the conventional cutting process using the laser may cause heat damage depending on a laser wavelength absorption rate of each material, while the cutting process according to the present embodiment may prevent the heat damage by using the ultrasonic wave cutter.

Figure 7A:
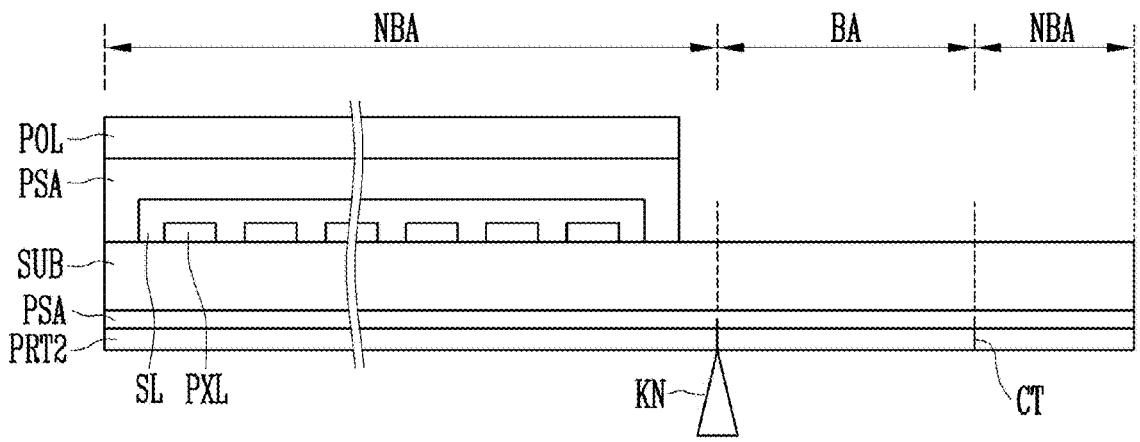
FIGS. 7A-7C are cross-sectional views sequentially illustrating a manufacturing method of a display device according to another exemplary embodiment of the present invention.
Figure 7B:
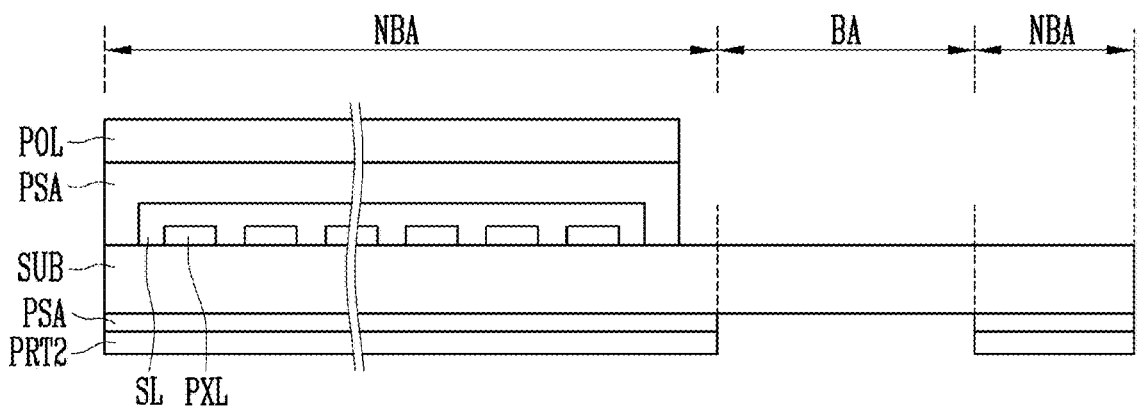
Figure 7C:
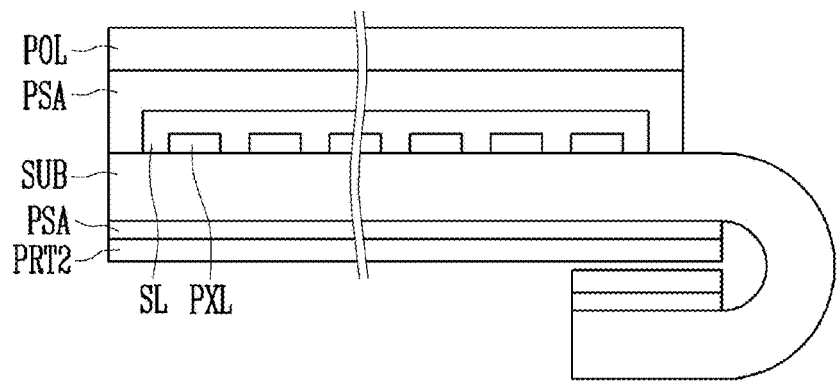

FIGS. 7A-7C are cross-sectional views sequentially illustrating a manufacturing method of a display device according to another exemplary embodiment of the present invention.

The display device according to the present exemplary embodiment may have at least a portion that is flexible. For example, the display device may have a bendable portion BA where a portion of the display device is bendable (or configured to be bendable) in the non-display area NDA, and a non-bendable portion NBA which is not bendable (or is not configured to be bendable). For example, a portion of the rear surface protective film PRT2 that is provided to the bendable portion BA may be removed to achieve smooth bending (or substantially smooth bending). For example, the rear surface protective film PRT2 may also be removed by utilizing the ultrasonic wave cutter KN.

Referring to FIG. 7A, because the rear surface protective film PRT2 is attached on (or to) a rear surface of the substrate SUB with the adhesive layer PSA therebetween, the cutting groove CT having a depth that is smaller than (or less than) the thickness of the adhesive layer PSA from a surface of the adhesive layer PSA is formed to penetrate the rear surface protective film PRT2 in a region corresponding to the bendable portion BA.

The cutting groove CT may be formed in the same manner as the above-described method using the ultrasonic cutter KN described above. In addition, it is possible to finely form the cutting groove CT by adjusting a height of the ultrasonic cutter KN by using a laser sensor together with the ultrasonic cutter KN.

Referring to FIG. 7B, a portion of the rear surface protective film PRT2 and a portion of the adhesive layer PSA provided to the bendable portion BA are removed depending on (or according to) the cutting groove CT. Accordingly, no rear surface protective film PRT1 is provided in the region corresponding to the bendable portion BA, but the rear surface protective film PRT2 is provided in the non-bendable portion NBA.

Referring to FIG. 7C, the bendable portion BA from which the rear surface protective film PRT2 is removed may be easily bendable to have a radius of curvature (e.g., a predetermined curvature radius).

Figure 8:
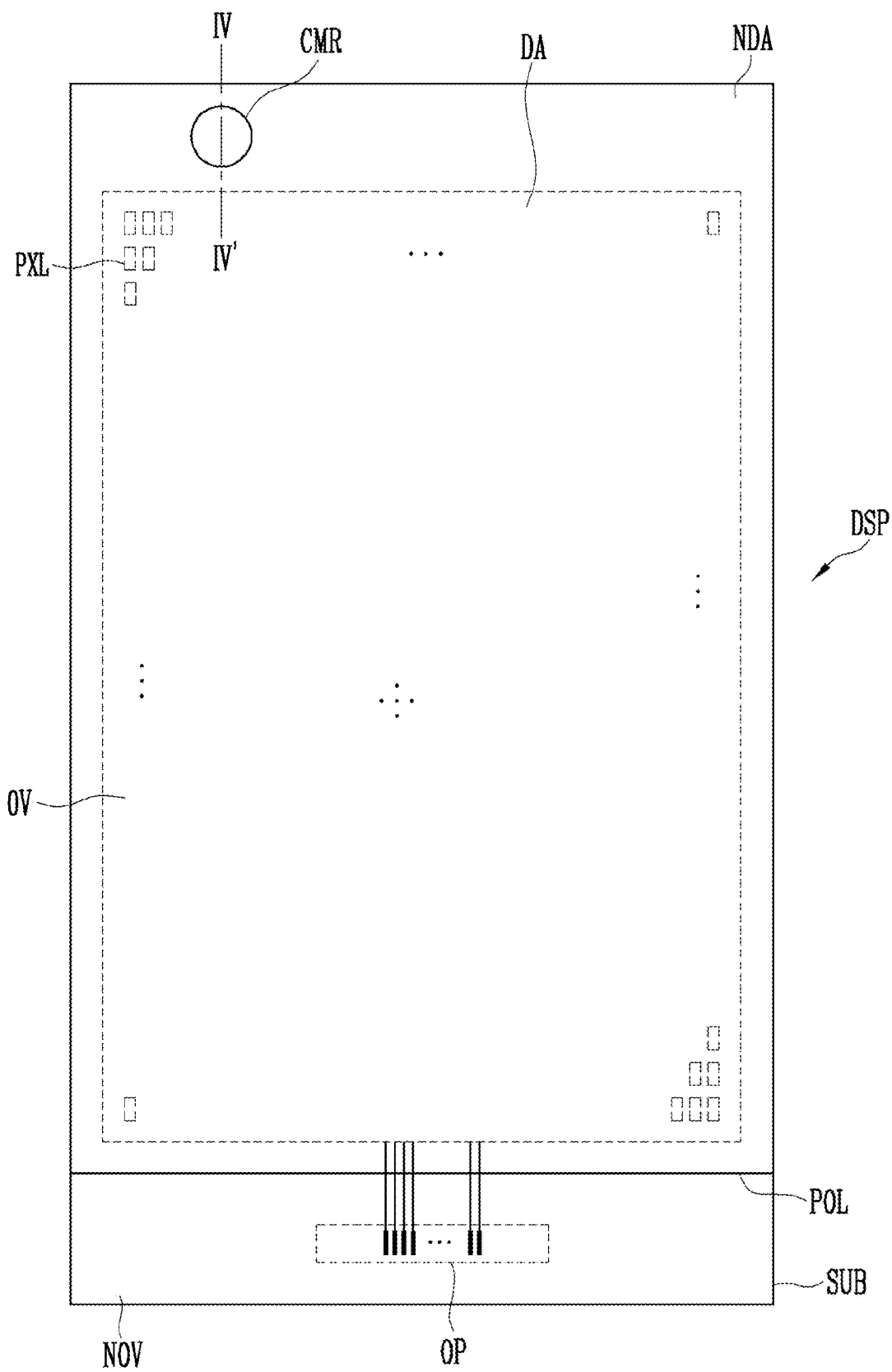
FIG. 8 is a top plan view illustrating a display device according to another exemplary embodiment of the present invention.
Figure 9A:
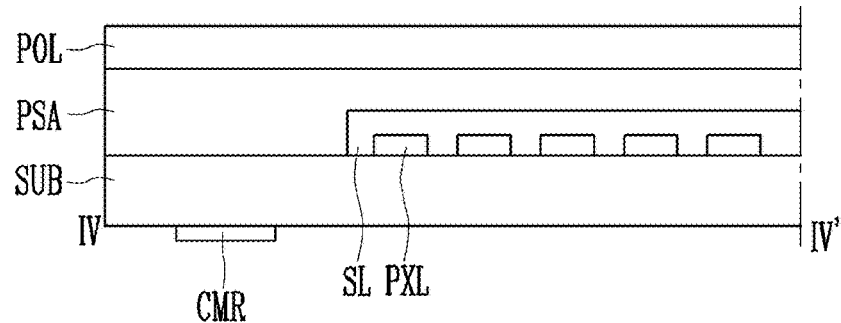
FIGS. 9A-9C are cross-sectional views taken along the line IV-IV' of FIG. 8, sequentially illustrating a manufacturing method of a display device according to another exemplary embodiment of the present invention.
Figure 9B:
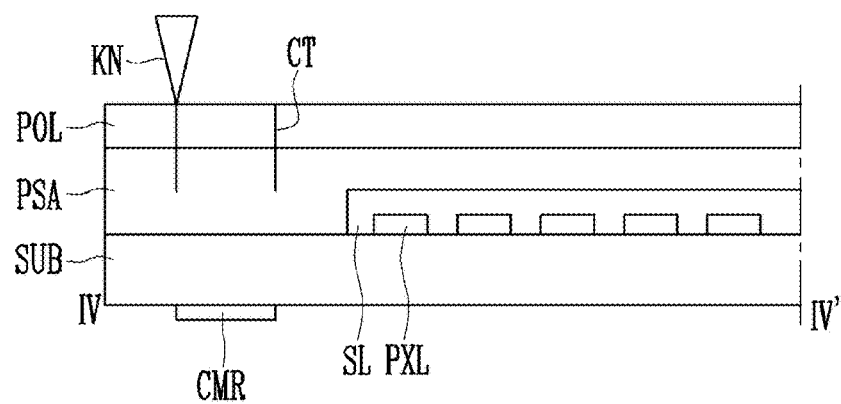
Figure 9C:
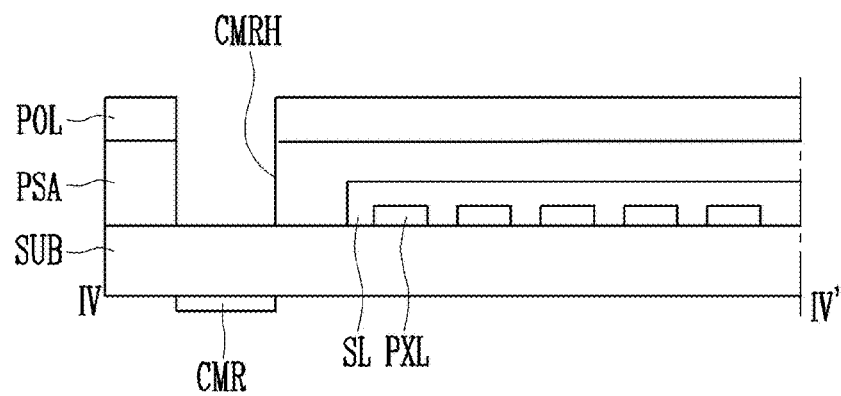

FIG. 8 is a top plan view illustrating a display device according to another exemplary embodiment of the present invention. FIGS. 9A-9C are cross-sectional views taken along the line IV-IV' of FIG. 8, sequentially illustrating a manufacturing method of a display device according to another exemplary embodiment of the present invention.

Referring to FIG. 8 and FIG. 9A, the display device according to the present exemplary embodiment may include a camera CMR. The camera CMR may be provided on a back side of the substrate SUB, and may be provided on a side of the non-display area NDA when viewed from a top plan view. However, the position of the camera CMR is not limited thereto. For example, the camera CMR may be provided in the display area DA as necessary.

All constituent elements provided to cover the camera CMR, for example, all constituent components provided on a front side of the substrate SUB are removed in a region corresponding to the camera CMR in order for the camera CMR to operate. For example, a camera opening (or a camera through-hole) penetrating the polarization film POL may be formed in the polarization film POL corresponding to the position of the camera CMR.

Referring to FIG. 9B, the cutting groove CT is formed in the polarization film POL and the adhesive layer PSA in order to form the camera through-hole.

The process of forming the cutting grooves CT may also be performed using the ultrasonic cutter KN and/or the laser sensor in the above-described manner. The cutting groove CT may be formed to penetrate the polarization film POL and to have a depth that is smaller than the thickness of the adhesive layer PSA from the surface of the adhesive layer PSA For example, an ultrasonic cutter KN having a closed shape (e.g., a circular shape) may be utilized, thereby reducing or minimizing damage that may occur in elements such as pixels.

Referring to FIG. 9C, a camera opening (or camera through-hole) CMRH is formed by removing a portion of the adhesive layer PSA and a portion of the polarization film POL depending on (or according to) the cutting groove CT. Accordingly, an image may be photographed by the camera CMR by removing the constituent elements covering the front side of the camera CMR. Although in some embodiments the polarization film POL and the adhesive layer PSA are removed, the present invention is not limited thereto. In some embodiments, the substrate SUB may also be removed.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate;
   pixels on the substrate; and
   a polarization film on the pixels and stretched in a first direction and a second direction opposite to the first direction,
   wherein the polarization film is cut at an end portion of the polarization film along a third direction, the third direction forming an acute angle with the first direction toward an outside of the polarization film.

2. The display device of claim 1, further comprising an adhesive layer between the pixels and the polarization film.

3. The display device of claim 2, further comprising a rear surface protective film at a rear surface of the substrate.

4. The display device of claim 3, wherein the substrate comprises:
   a display area in which the pixels are located; and
   a non-display area at at least a side of the display area,
   wherein the substrate has a bendable portion in the non-display area.

5. The display device of claim 4, wherein the rear surface protective film is at a portion other than the bendable portion.

6. The display device of claim 1, further comprising a camera at a rear surface of the substrate,
   wherein the polarization film has a camera opening at a portion corresponding to the camera.

* * * * *